United States Patent
Mori et al.

(10) Patent No.: US 6,456,102 B1
(45) Date of Patent: Sep. 24, 2002

(54) EXTERNAL TEST ANCILLARY DEVICE TO BE USED FOR TESTING SEMICONDUCTOR DEVICE, AND METHOD OF TESTING SEMICONDUCTOR DEVICE USING THE DEVICE

(75) Inventors: Hisaya Mori, Hyogo (JP); Shinji Yamada, Hyogo (JP); Teruhiko Funakura, Tokyo (JP)

(73) Assignees: Mitsubishi Denki Kabushiki Kaisha, Tokyo (JP); Ryoden Semiconductor System Engineering Corporation, Hyogo (JP)

( * ) Notice: Subject to any disclaimer, the term of this patent is extended or adjusted under 35 U.S.C. 154(b) by 0 days.

(21) Appl. No.: 09/927,469

(22) Filed: Aug. 13, 2001

(30) Foreign Application Priority Data

Feb. 8, 2001 (JP) .................................... 2001-032850

(51) Int. Cl.$^7$ ............................................. G01R 31/26
(52) U.S. Cl. ...................................................... 324/765
(58) Field of Search ............................ 324/158.1, 537, 324/555, 755, 765; 340/146.2; 341/120; 326/54; 714/32, 718, 763; 365/49, 189.07, 189.11, 201, 203

(56) References Cited

U.S. PATENT DOCUMENTS 5,594,612 A * 1/1997 Henrion ...................... 341/120
5,646,521 A * 7/1997 Rosenthal et al. ........ 324/158.1
5,659,312 A * 8/1997 Sunter et al. ................ 341/120
6,331,770 B1 * 12/2001 Sugamori ................ 324/158.1

FOREIGN PATENT DOCUMENTS

| JP | 08-233912 | 9/1996 |
| JP | 09-189750 | 7/1997 |

* cited by examiner

Primary Examiner—N. Le
Assistant Examiner—Etienne LeRoux
(74) Attorney, Agent, or Firm—McDermott, Will & Emery

(57) ABSTRACT

An external test ancillary device (BOST device) analyzes measured information output from a semiconductor integrated circuit and transmits a result of analysis to a semiconductor test apparatus. The external test ancillary device includes a DAC counter for generating input data; a digital-to-analog converter for converting the data output from the counter from a digital signal into an analog signal; an analog-to-digital converter which receives data output from the digital-to-analog converter by way of a loopback line and converts the data from an analog signal into a digital signal; a DSP analysis section for performing self-diagnostic operation on the basis of data output from the analog-to-digital converter; measured data memory, an address counter, and a data write control circuit.

11 Claims, 6 Drawing Sheets

US 6,456,102 B1

EXTERNAL TEST ANCILLARY DEVICE TO BE USED FOR TESTING SEMICONDUCTOR DEVICE, AND METHOD OF TESTING SEMICONDUCTOR DEVICE USING THE DEVICE

BACKGROUND OF THE INVENTION

1. Field of the Invention

The present invention relates to a semiconductor test apparatus for testing an analog circuit (e.g., an analog-to-digital converter or a digital-to-analog converter) which is one of LSIs to be tested [hereinafter called "DUT" (device under test)] by an LSI test apparatus (hereinafter called "tester"), as well as to a method of testing a semiconductor device using the semiconductor test apparatus.

2. Background Art

Recently, in relation to a system LSI (embodied in a one-chip LSI consisting of a plurality of functionally-systematized circuit modules or embodied in a chip set LSI), combination of digital and analog circuits (i.e., a system LSI handling a mixed signal), having high-performance and precision, has been rapidly pursued. In order to cope with such a tendency, tester manufacturers have provided testers compatible with a semiconductor integrated circuit using a mixed signal. A tester compatible with a semiconductor integrated circuit using a mixed signal has high performance specifications and inevitably becomes expensive. For this reason, one proposed resolution is recycling an existing low-speed, low-precision tester (e.g., a tester for a logic LSI), to thereby avoid a hike in the price of a tester.

A big problem with such a test apparatus lies in a characteristic test for a converter circuit for converting a digital signal into an analog signal (digital-to-analog converter, hereinafter called a "DAC") as well as in a characteristic test for a converter circuit for converting an analog signal into a digital signal (hereinafter called an "ADC") In a testing environment of a general tester, connection jigs for connecting a tester with a DUT, such as a plurality of DUT circuit boards (simply called "DUT boards") and cables, are provided at a plurality of points along a measurement path extending from measurement equipment provided in the tester to a DUT. Further, the measurement path is long and accounts for occurrence of noise and a drop in measurement accuracy. A limitation is imposed on the speed of a low-speed tester, and hence the low-speed tester cannot conduct a test at a real operating speed, thereby posing a fear of an increase in a time required for conducting mass-production testing of a system LSI.

FIG. 6 is a block diagram showing a BOST (Built-off-self-test) device of a related-art semiconductor test apparatus which has been conceived for shortening a test time according to a method of testing a DAC of a DUT and which employs a technique for conducting a test through use of an external ADC disposed in the vicinity of a DUT.

As shown in the drawing, reference numeral 1 designates a tester; 2 designates a DUT; 3 designates a digital-to-analog converter section of the DUT 2; 4 designates an output section of the DUT 2; 5 designates a CPU of the DUT 2; 6 designates an analog-to-digital converter section; 7 designates a digital signal entered by way of the tester 1; 8 designates an analog signal produced through digital-to-analog conversion; 9 designates a digital signal produced through analog-to-digital conversion; 10 designates a CPU of the tester 1; 11 designates RAM; 12 designates a signal for controlling input/output operations of the RAM 11; and 13 designates a digital signal output from the RAM 11.

The operation of the BOST device will now be described.

The digital signal 7 entered by way of the tester 1 is converted into an analog signal by means of the digital-to-analog converter section 3 of the DUT 2. The thus-converted signal is further subjected to analog-to-digital conversion in the analog-to-digital converter 6, and the thus-converted data are stored in the RAM 11. After all these operations have been performed, the data stored in the RAM 11 are output. The thus-output data and the data input to the digital-to-analog converter section 3 of the DUT 2 are compared by the tester 1, thus making an evaluation of the DAC.

FIG. 7 is a block diagram showing a BOST device of a related-art semiconductor test apparatus which has been conceived for shortening a test time according to a method of testing an ADC of a DUT and which employs a technique for conducting a test through use of an external DAC disposed in the vicinity of a DUT. In FIG. 7, elements which are identical with those shown in FIG. 6 are as signed the same reference numerals, and repeated explanations thereof are omitted.

As shown in FIG. 7, reference numeral 14 designates a digital-to-analog converter; 15 designates a DUT; 16 designates an analog-to-digital converter section of the DUT 15; 17 designates an output section of the DUT 15; and 18 designates a CPU of the DUT 15.

The operation of the BOST device will now be described.

The digital signal 7 entered by way of the tester 1 is subjected to digital-to-analog conversion in the digital-to-analog converter 14, and the thus-converted signal is further subjected to analog-to-digital conversion in the analog-to-digital conversion section 16 of the DUT 15. Further the thus-converted data are stored in the RAM 11. After all these operations have been performed, the data stored in the RAM 11 are output. The thus-output data and the data input to the digital-to-analog converter 14 are compared by the tester 1, thus making an evaluation of the ADC.

The related-art semiconductor test apparatus shown in FIG. 6 suffers the following problems.

All data, addresses, and control signals stored in measured data storage memory; i.e., RAM, connected to an external ADC; i.e., an analog-to-digital converter,. must be supplied from a tester [a CPU and a timing pattern generator (TPG)]. The majority of pin electronics provided on a tester are occupied for testing a single ADC, thus imposing limitations on simultaneous measurement of a plurality of ADCs. Test results are evaluated after all tests have been completed. Hence, an effect of shortening a time required for effecting a real test is small. Further, measured data must be uploaded to a CPU of the tester, thus resulting in a chance of an increase arising in a processing time including communications time. Further, the related-art semiconductor test apparatus has failed to describe a control method and procedures and is devoid of specificity of a method of shortening a test time.

The related-art semiconductor test apparatus shown in FIG. 7 suffers the same problem as that encountered by the related-art test apparatus shown in FIG. 6.

SUMMARY OF THE INVENTION

The present invention has been conceived to solve the problems set forth and is aimed at providing a semiconductor test apparatus which is susceptible of simultaneously measuring a plurality of DUTs, enables shortening of a real test time, and obviates a necessity for uploading measured data to a CPU of the tester, as well as providing a method of testing a semiconductor device using the semiconductor test apparatus. According to one aspect of the present invention, an external test ancillary device which analyzes measured information output from a circuit under test and transmits a result to a semiconductor test apparatus, comprises a input data generator for generating data. Further the device comprises a first data converter for converting the data output from the input data generator from one signal scheme into another signal scheme. Further the device comprises a second data converter for converting input data from another signal scheme into one signal scheme. Further the device comprises a loopback line for supplying data output from the first data converter to the second data converter in the device. Further the device comprises a self-diagnostic section for performing a self-diagnostic operation on the basis of data output from the second data converter.

Other and further objects, features and advantages of the invention will appear more fully from the following description.

DETAILED DESCRIPTION OF THE PREFERRED EMBODIMENTS

Embodiments of the present invention will be described by reference to the accompanying drawings.

First Embodiment

Figure 1:
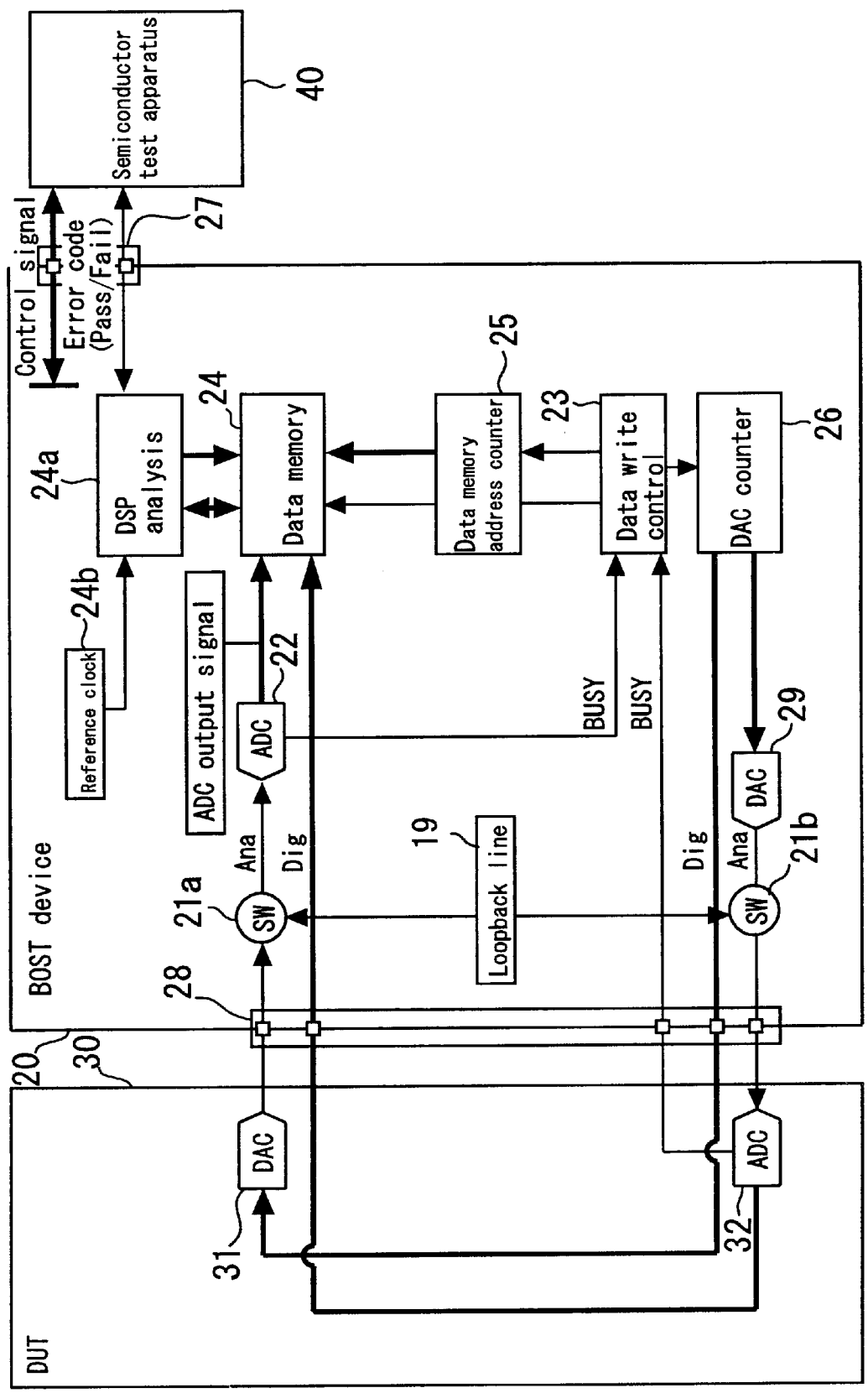
FIG. 1 is a block diagram showing a semiconductor test apparatus according to a first embodiment of the present invention.

FIG. 1 is a block diagram showing a semiconductor test apparatus according to a first embodiment of the present invention.

As shown in the drawing, reference numeral 20 designates a BOST device (the external test ancillary device); 21a designates a switch (SW) serving as a first switch using, e.g., an analog switch; 21b designates a switch (SW) serving as a second switch using, e.g., an analog switch; and 22 designates an analog-to-digital converter (ADC) serving as a second data converter which is connected to an output terminal of the switch 21a and which converts one signal scheme (i.e., an analog signal scheme) into another signal scheme (i.e., a digital signal scheme).

Reference numeral 23 designates a data write control section serving as data write control means. A BUSY signal (i.e., a flag representing that conversion is being performed) output from the analog-to-digital converter 22 and another BUSY signal (i.e., a flag representing conversion is being performed) output from an analog-to-digital converter 32 to be described later are input to the data write control section 23. Reference numeral 24 designates measured data memory serving as storage means which stores, as measured data, a signal output from the analog-to-digital converter 22 and a signal output from the analog-to-digital converter 32. Reference numeral 24a designates a DSP analysis section having DSP (digital-signal -processor) program ROM. The DSP analysis section 24a serves as analysis means for acquiring measured data from the measured data memory 24 and performs arithmetic operation. Reference numeral 24b designates a reference clock signal generator for producing a reference clock signal to the DSP analysis section 24a.

Reference numeral 25 designates a measured data memory address counter serving as address update means which updates an address of the measured data memory 24 under control of the data write control circuit 23. Reference numeral 26 designates a DAC counter serving as an input data generator. The DAC counter 26 forms digital-to-analog converter (DAC) input data under control of the data write control circuit 23. Reference numeral 27 designates BOST-I/F section provided for an external semiconductor test apparatus 40; 28 designates a BOST-I/F section provided for an external DUT 30; and 29 designates a digital-to-analog converter serving as a first data converter. The digital-to-analog converter 29 is provided between a switch 21b and a DAC counter 26 and converts one signal scheme (i.e., a digital signal scheme) into another signal scheme (i.e., an analog signal scheme).

The DUT 30 serving as a circuit under test has a digital-to-analog converter 31 and an analog-to-digital converter 32. The digital-to-analog converter 31 converts a digital signal output from the DAC counter 26 into an analog signal and supplies the result to the analog-to-digital converter 22 by way of the switch 21a. Further, the analog-to-digital converter 32 converts, into a digital signal, an analog signal supplied from a digital-to-analog converter 29 by way of a switch 21b.

A loopback line 19 is provided between the switches 21a and 21b. The loopback line 19 is connected to the switches 21a and 21b at the time of a self-diagnostic or self-correction mode to be described later. At the time of a normal operation in which the DUT 30 is tested, the switches 21a and 21b connect the DUT 30 to the BOST device 20. In contrast, at the time of self-diagnostic or self-correction mode, the switches 21a and 21b are switched to the loopback line 19, thereby connecting an output terminal of the digital-to-analog converter 29 to an input terminal of the analog-to-digital converter 22. The constituent elements 23, 24, 24a, 24b, and 25 constitute self-diagnostic section.

The operation of the test apparatus will now be described.

At the time of normal operation in which the DUT 30 is tested, the DUT 30 and the BOST device 20 are connected together by means of the switches 21a and 21b. Digital data output from the DAC counter 26 are input to the digital-to-analog converter 29, and an analog output resulting from digital-to-analog conversion of the digital data is converted into a digital signal by means of the analog-to-digital converter 32 of the DUT 30. The digital signal is stored in the measured data memory 24, and the memory data are read and analyzed by the DSP analysis section 24a. The result of analysis is sent to the external semiconductor test apparatus 40.

Similarly, digital data output from the DAC counter 26 are input directly to the digital-to-analog converter 31 of the DUT 30. An analog signal resulting from analog-to-digital conversion of the digital data is converted into a digital signal by means of the analog-to-digital converter 22. The digital signal is stored in the measured data memory 24, and memory data are read from the memory 24 and analyzed by the DSP analysis section 24a. The result of analysis is sent to the external semiconductor test apparatus 40.

The self-diagnostic function of the BOST device 20 will next be described.

At the time of a self-diagnostic operation, a digital-to-analog converter 29 which has been adjusted beforehand by means of external measurement is taken as a reference. Digital data output from the DAC counter 26 are input to the digital-to-analog converter 29. An analog output resulting from digital-to-analog conversion of the digital data is supplied to the analog-to-digital converter 22 by way of the loopback line 19 by means of switching a line through use of the switches 21a and 21b. The analog output is converted to a digital signal, and the digital signal is sampled, thereby performing self-diagnostic of analog characteristics of the analog-to-digital converter 22.

In other respects, other individual digital circuits provided on the BOST device 20 writs data into and read data from hardware of the BOST device 20 (other circuits provided on the BOST device 20 exclusive of the DSP analysis section 24a ), through use of the DSP analysis section 24a provided on the BOST device 20, thus effecting a test. The result of test is sent to a controller, such as the semiconductor test apparatus 40, from the DSP analysis section 24a.

The self-diagnostic function will be described in detail by reference to FIG. 2.

Figure 2:
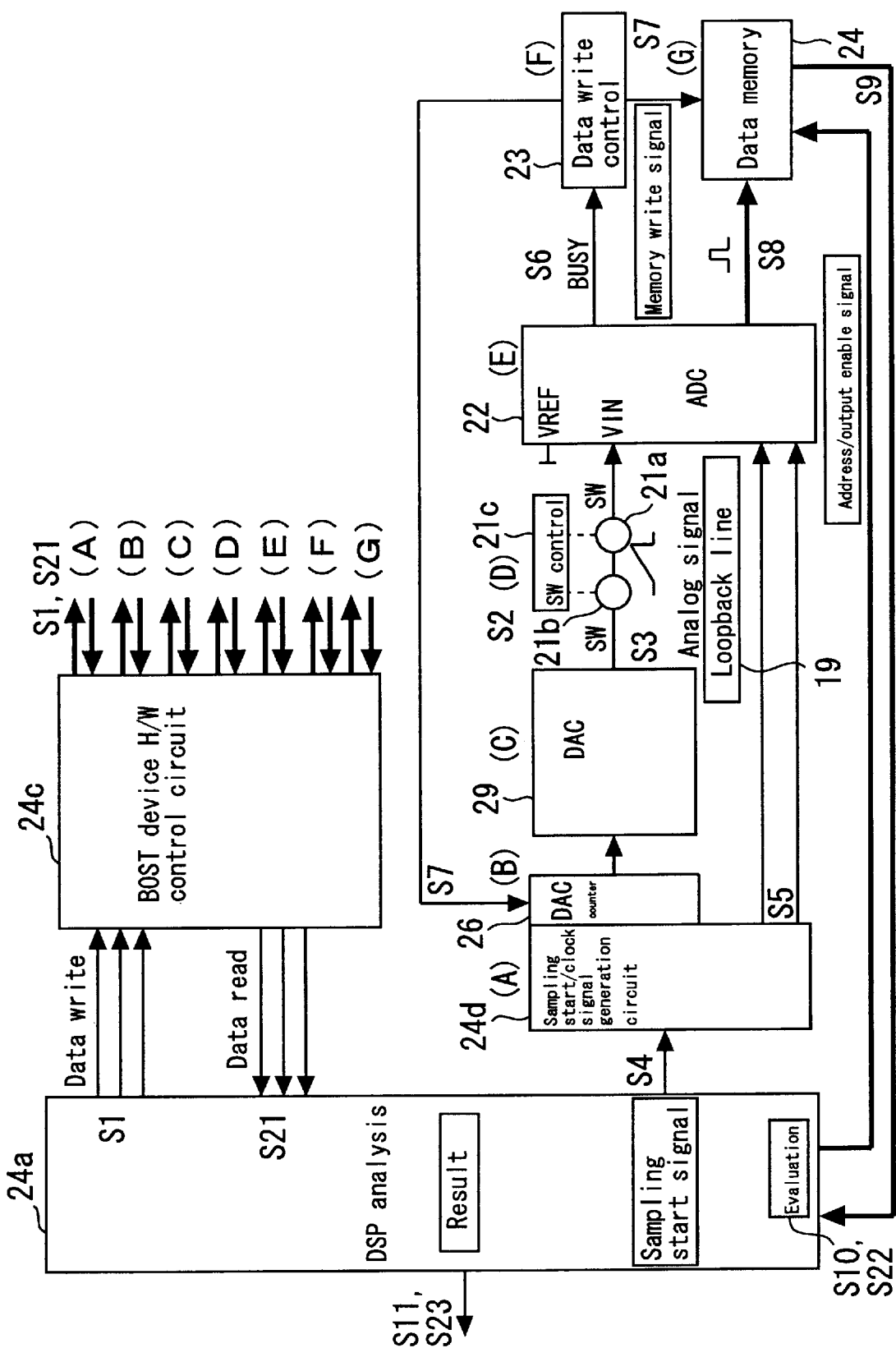
FIG. 2 is a schematic diagram for describing the self-diagnostic function according to the first embodiment.

FIG. 2 is a schematic diagram for describing the self-diagnostic function according to the first embodiment.

In FIG. 2, elements which are identical with those shown in FIG. 1 are assigned the same reference numerals, and repeated explanations thereof are omitted. A BOST device hardware control circuit 24c which is to serve as external test ancillary device hardware control means and a sampling start/sampling clock signal generation circuit 24d, both of which are not shown in FIG. 1, are added to FIG. 2.

Operation procedures of a self-diagnostic function of an analog section will now be described.

In accordance with an instruction from the DSP analysis section 24a, the BOST device hardware control circuit 24c sets conditions on individual circuits (step S1). Reference symbols (A) through (C) and (E) through (G) representing exchange of signals performed at the time of setting of conditions are assigned to the BOST device hardware control circuit 24c and corresponding circuits. Next, setting of conditions on a SW control section 21c and activation of the loopback line 19 are performed in the same manner as in step S1 (step S2).

Reference symbol (D) showing exchange of a signal performed in step S2 is assigned to the BOST device hardware control circuit 24c and to the switch control section 21c serving as switch control means. By way of the loopback line 19, a signal output from an analog measurement section DAC; that is, the digital-to-analog converter 29, is input to the analog-to-digital converter 22 (step S3). The DSP analysis section 24a outputs a sampling start signal, and the signal is input to the sampling start/sampling clock signal generation circuit 24d (step S4).

The sampling start/sampling clock signal generation circuit 24d inputs a sampling start signal and sampling clock signal to the analog-to-digital converter 22 (step S5). An analog signal output from the digital-to-analog converter 29 is converted into a digital signal. The data write control circuit 23 produces a DAC counter update signal and a memory write signal, by means of a BUSY signal (i.e., a flag representing that conversion is being performed) output from the analog-to-digital converter 22 during the course of conversion operation being performed by the analog-to-digital converter 22 (step S6).

In response to the DAC counter update signal output from the data write control circuit 23, the DAC counter 26 is updated. Further, in response to the memory write signal output from the data write control circuit 23, data are written into the measured data memory 24 (step S7). The data converted by the analog-to-digital converter 22 are written into the measured data memory 24 by means of a memory write signal (step S8).

After completion of measurement of all codes, the DSP analysis section 24a acquires memory data from the measured data memory 24 (step S9). The DSP analysis section 24a performs arithmetic operation on the basis of the thus-acquired data, thus evaluating specifications of the result (step S10). The DSP analysis section 24a transmits the result of evaluation to the external semiconductor test apparatus 40 (step S11).

Operation procedures of a self-diagnostic function of a digital section will now be described.

In this way, in accordance with an instruction output from the DSP analysis section 24a, the BOST apparatus hardware control circuit 24c sets conditions on individual circuits and reads data output from individual circuits by way of the BOST device hardware control circuit 24c (step S21).

The data acquired in step S21 are compared with an expected value in the DSP analysis section 24a (step S22). The result of evaluation performed in step S22 is transmitted to the external semiconductor test apparatus 40 (step S23).

As mentioned above, in the present embodiment, quality control of the BOST device is facilitated. Diagnostic software is maintained and managed by a processor, such as a DSP provided on the BOST apparatus (e.g., processor program ROM). Hence, there is obviated a necessity of preparing diagnostic software, which would otherwise be prepared when a measurement function of a tester is used, for each tester. Thus, application of the BOST device to various types of testes is easy.

Second Embodiment

In the present embodiment, the BOST device is provided with a self-correction function so as to be able to correct an ADC and a DAC of an analog measurement section of the BOST device (i.e., correction of the ADC and DAC by means of changing a reference power supply) in a programmable manner from a DSP analysis section provided on the BOST device.

Figure 3:
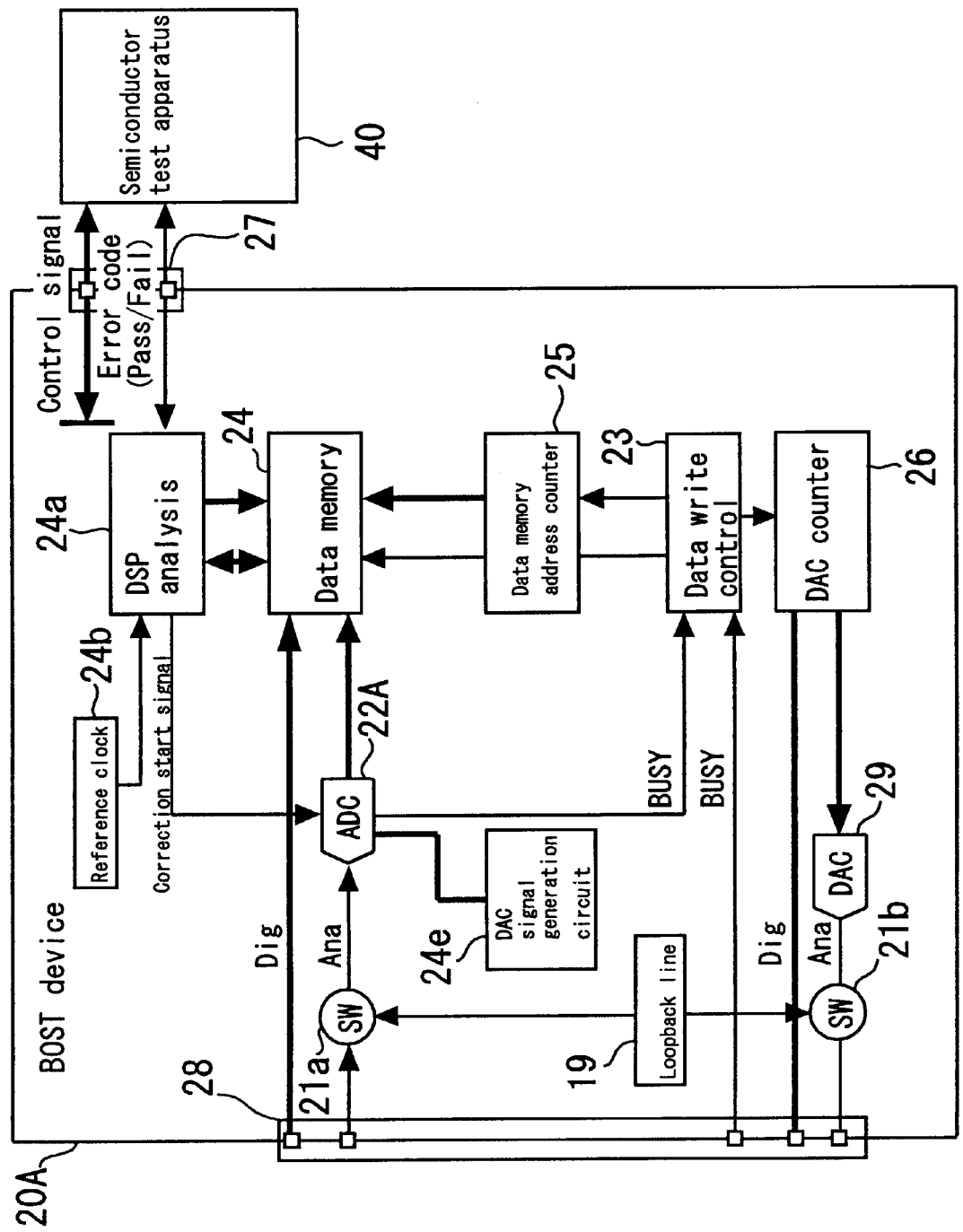
FIG. 3 is a block diagram showing a test apparatus according to a second embodiment of the present invention.

FIG. 3 is a block diagram showing a test apparatus according to a second embodiment of the present invention. In FIG. 3, elements which are identical with those shown in FIG. 1 are assigned the same reference numerals, and repeated explanations thereof are omitted.

In the drawing, reference numeral 20A designates a BOST device; 22A designates an analog-to-digital converter (ADC) connected to an output terminal of the switch 21a; and 24e designates a DAC control signal generation circuit serving as control signal generation means which includes a reference power control DAC of the analog-to-digital converter 22A. A correction start signal is supplied from the DSP analysis section 24a to an analog-to-digital converter (ADC) 22A. In other respects, the test apparatus according to the present embodiment is identical in configuration with that shown in FIG. 1.

Figure 4:
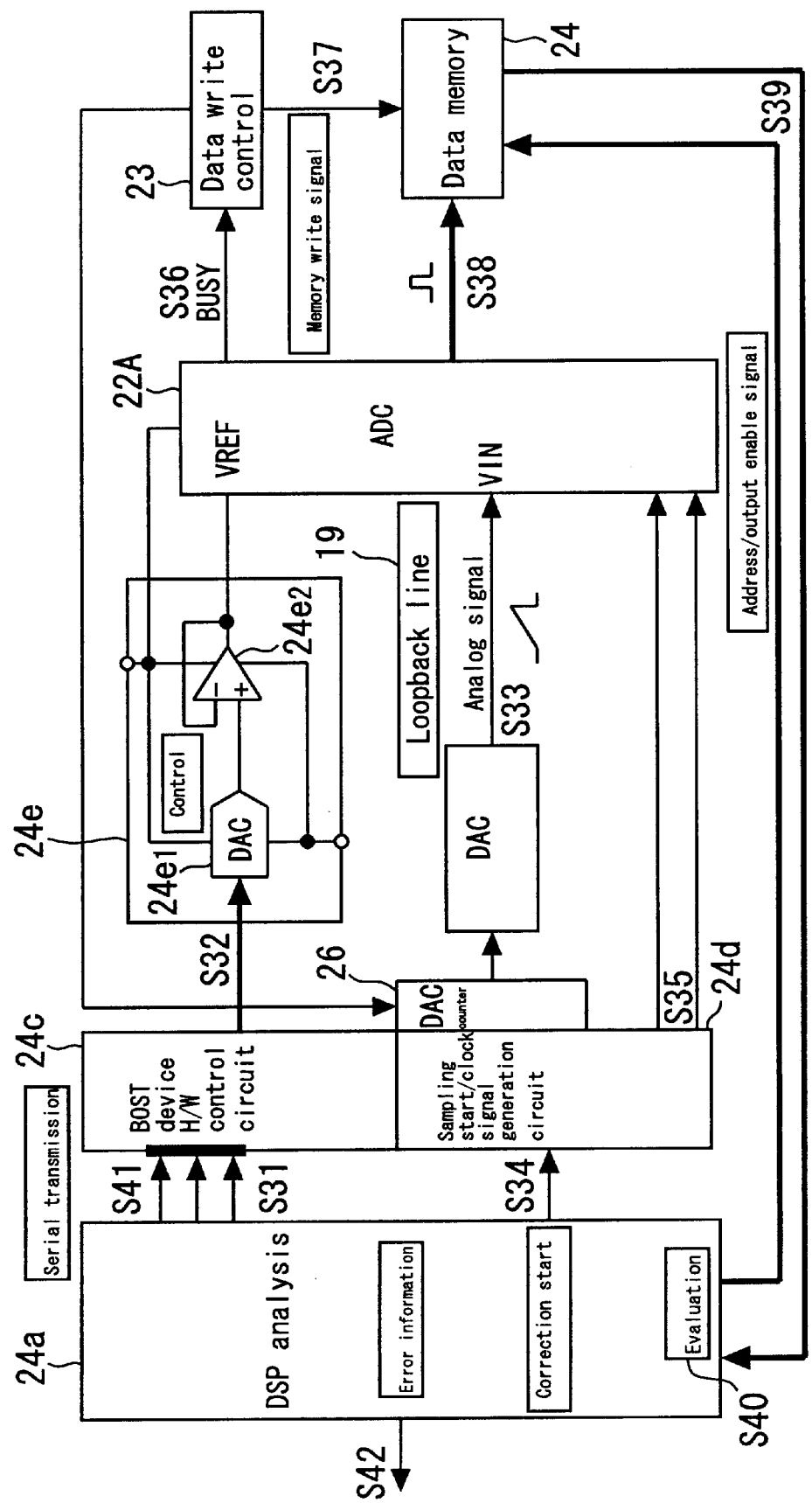
FIG. 4 is a block diagram for describing a self-correction function according to the second embodiment of the present invention.

FIG. 4 is a block diagram for describing a self-correction function according to the second embodiment of the present invention.

In FIG. 4, elements which are identical with those shown in FIG. 3 are assigned the same reference numerals, and repeated explanations thereof are omitted. Even in this case, a BOST device hardware control circuit 24c and a sampling start/sampling clock signal generation circuit 24d, both of which are not shown in FIG. 3, are added to FIG. 4. A DAC control signal generation circuit 24e is constituted of a control DAC 24e 1 which receives data from the BOST device hardware control circuit 24c, and an operational amplifier 24e 2 connected to an output terminal of the control DAC 24e 1.

Operation procedures of self-correction function will next be described.

In accordance with an instruction from the DSP analysis section 24a, the BOST device hardware control circuit 24c sets conditions on individual circuits. Setting of conditions on a SW control section (not shown) and activation of the loopback line 19 are performed in the same manner (step S31). Data are input to the ADC reference power control DAC 24e 1 in the same manner as in step S31 (step S32). A signal output from the digital-to-analog converter 29 is input to the analog-to-digital converter 22A by way of the loopback line 19 (step S33). The DSP analysis section 24a outputs a correction start signal, and the signal is input to the sampling start/sampling clock signal generation circuit 24d (step S34).

A sampling start signal and a sampling clock signal are input to the analog-to-digital converter 22A (step S35). An analog signal output from the digital-to-analog converter 29 is converted into a digital signal. The data write control circuit 23 produces a DAC counter update signal and a memory write signal, by means of a BUSY signal (i.e., a flag representing that conversion is being performed) output from the analog-to-digital converter 22A during the course of conversion operation being performed by the analog-to-digital converter 22A (step S36).

In response to the DAC counter update signal output from the data write control circuit 23, the DAC counter 26 is updated. Further, in response to the memory write signal output from the data write control circuit 23, data are written into the measured data memory 24 (step S37). The data converted by the analog-to-digital converter 22A are written into the measured data memory 24 by means of a memory write signal (step S38).

After completion of measurement of all codes, the DSP analysis section 24a acquires memory data from the measured data memory 24 (step S39). The DSP analysis section 24a performs arithmetic operation on the basis of the thus-acquired data, thus evaluating specifications of the result (step S40). On the basis of diagnostic evaluation performed in step S40, the DSP analysis section 24a determines whether or not correction is necessary. Data to which a correction value is added again are input to the ADC reference power control DAC 24e 1 by way of the BOST device hardware control circuit 24c (step S41).

The processing operations set forth are iterated a given number of times until they fall within an appropriate correction range. If the DSP analysis section 24a has determined that correction is not possible, the DSP analysis section 24a transmits error information to an external controller such as the semiconductor test apparatus 40 (step S42).

As mentioned above, in the present embodiment, quality control of a BOST device is facilitated. Diagnostic software is maintained and managed by a processor, such as a DSP provided on the BOST apparatus (e.g., processor program ROM). Hence, there is obviated a necessity of preparing diagnostic software, which would otherwise be prepared when a measurement function of a tester is used, for each tester. Thus, application of the BOST device to various types of testes is easy. Further, measurement accuracy can be improved.

Third Embodiment

The present embodiment is substantially a combination of the first and second embodiments. A round of conservation operations such as self-diagnostic and self-correction operations are performed under control of the DSP analysis section. If self-correction operation is determined to be necessary as a result of self-diagnostic operation, correction is performed. Subsequently, a diagnostic operation is again performed, and the result of diagnosis is transmitted to an external test apparatus.

Figure 5:
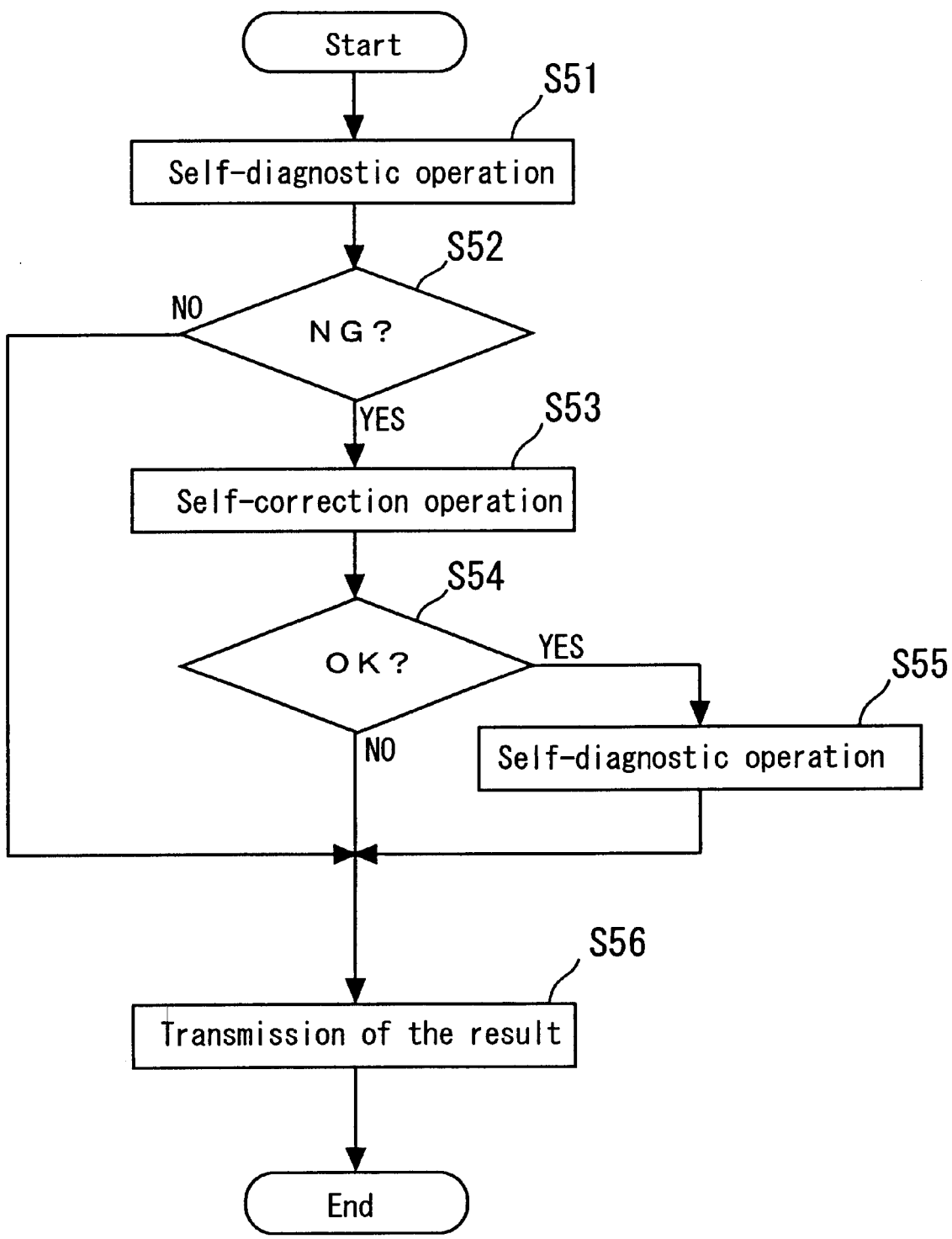
FIG. 5 is a flowchart showing a test apparatus according to a third embodiment of the present invention.
Figure 6:
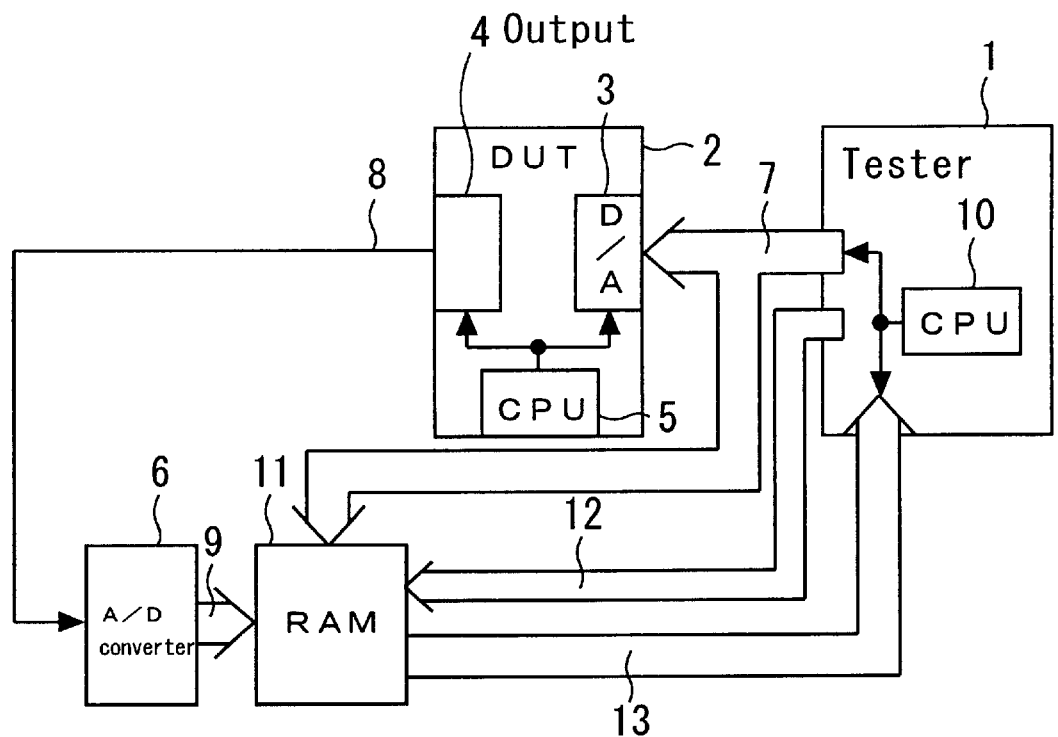
FIG. 6 is a block diagram showing a BOST device of a related-art semiconductor to test apparatus.
Figure 7:
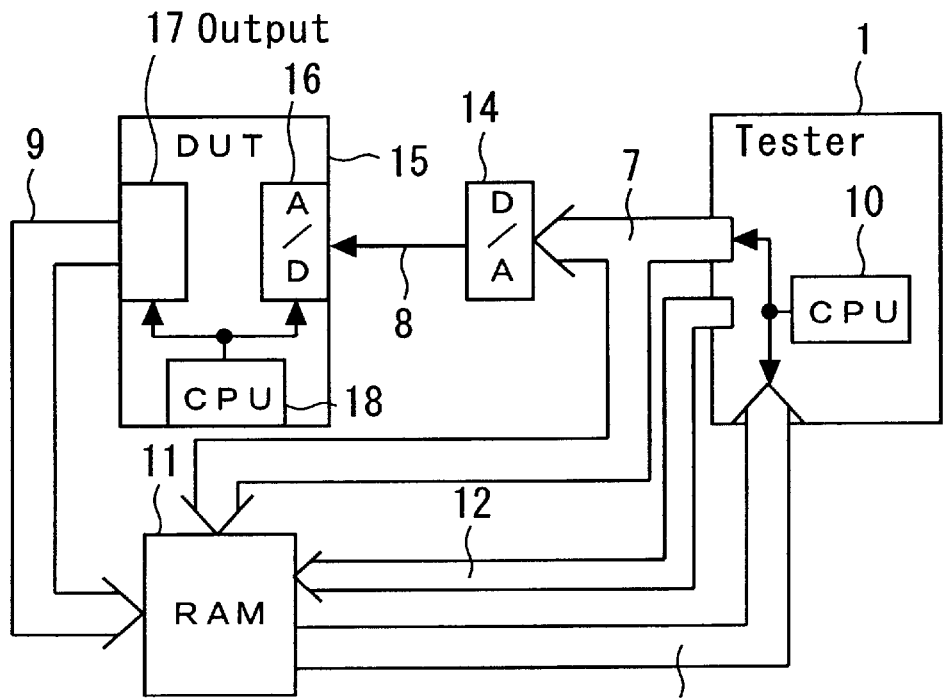
FIG. 7 is a block diagram showing a BOST device of a related-art semiconductor test apparatus

At FIG. 5 is a flowchart showing a test apparatus according to a third embodiment of the present invention.

First, a self-diagnostic operation is performed (step S51), and the result of diagnosis is evaluated (step S52). If the result of diagnostic operation is determined to be acceptable, the result is transmitted in its present form to the external semiconductor test apparatus 40 as PASS information. In contrast, if the result of diagnostic operation is determined to be unacceptable, a self-correction operation is performed (step S53). Next, the result of the self-correction operation is evaluated (step S54). If the result of evaluation is unacceptable, a self-diagnostic operation is performed again. Further, the result is transmitted to the external semiconductor test apparatus 40 as PASS information (step S55).

If in step S54 the result of evaluation is determined to be unacceptable, the round of operations set forth are iterated a given number of times until they fall within an appropriate range. When the DSP analysis section 24a determines that correction is not possible, in step S56 error information (Fail) is transmitted to the external semiconductor test apparatus 40.

In the present embodiment, quality control of a BOST device is facilitated. Diagnostic software is maintained and managed by a processor, such as a DSP provided on the BOST apparatus (e.g., processor program ROM). Hence, there is obviated a necessity of preparing diagnostic software, which would otherwise be prepared when a measurement function of a tester is used, for each tester. Thus, application of the BOST device to various types of testes is easy. Further, measurement accuracy can be improved.

A semiconductor device can be tested through use of the BOST device set forth. By means of the test method for testing a semiconductor device, there is provided a highly-reliable and high-quality semiconductor device.

In each of the previous embodiments, one signal scheme is a digital signal, and another signal scheme is an analog signal. The embodiments can be implemented even when an analog signal is taken as one signal scheme and a digital signal is taken as another signal scheme, and there is also yielded the same advantage as those yielded in the previous embodiments.

The features and advantages of the present invention may be summarized as follows.

According to one aspect, diagnostic software is maintained and managed by a processor, such as a DSP provided on the BOST apparatus. Hence costs can be diminished by means of a reuse or recycle of a low-speed, low-precision existing LSI test apparatus. The present invention enables realization of a system configuration (i.e., application of the semiconductor test apparatus to LSI testers of different types) which does not depend on an LSI tester. As a result, there can be effected facilitation of application of the test apparatus to different types of LSI circuits to be tested, facilitation of quality control (inspection and adjustment) of the LSI tester; improvements in quality of design of an LSI, inexpensive evaluation of LSI design; facilitation of development of the LSI tester to an analysis system; and standardization of a test analysis system (i.e., analysis can be effected through use of a common system from a design process to a mass-production process). Further there is yielded an advantage of ability to perform self-diagnostic or self-correction operation without fail. Further there is yielded an advantage of ability to improve measurement performance of self-diagnostic operation, to speed up a characteristic test, and to render the test apparatus compatible with an increase in the precision of a characteristic test.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2001-032850, filed on Feb. 8, 2001 including specification, claims, drawings and summary, on which the Convention priority of the present application is based, are incorporated herein by reference in its entirety.

What is claimed is:

1. An external test ancillary device which analyzes measured information output from a circuit under test and transmits a result to a semiconductor test apparatus, comprising:

an input data generator for generating data of one signal scheme;

a first data convert for converting the data output from the input data generator from the one signal scheme into another signal scheme;

a second data converter for converting input data from the another signal scheme into the one signal scheme;

a loopback line for supplying data output from the first data converter to the second data converter in the device at the time of a self-diagnostic test operation; and a self-diagnostic section for performing a self-diagnostic operation of characteristics of internal circuits on the basis of data output from the second data converter.

2. The external test ancillary device according to claim 1, further comprising:

a first switch disposed between the circuit under test and the second data converter; and a second switch disposed between the circuit under test and the first data converter;

wherein an output terminal of the first data converter is connected to an input terminal of the second data converter by way of the loopback line at the time of the self-diagnostic operation by means of the switches.

3. The external test ancillary device according to claim 2, further comprising a switch control section; and a built-off-self-test device hardware control circuit for setting conditions to individual circuits of the device in accordance with an instruction output from the self-diagnostic section;

wherein the built-off-self-test device hardware control circuit controls switching between the first and second switch by way of the switch control section.

4. The external test ancillary device according to claim 1, wherein the self-diagnostic section comprises, a measured data memory for storing data output from the second data converter;

as a digital-signal-processor analysis section for reading data from the measured data memory and analyzing the read data, a measured data memory address counter for updating an address pertaining to the measured data memory; and a data write control section for controlling the measured data memory, the measured data memory address counter, and the input data generator.

5. The external test ancillary device according to claim 4, wherein the data write control section produces at least an update signal for the input data generator and a memory write signal for the measured data memory, on the basis of a flag signal representing that the second data converter is performing conversion operation.

6. The external test ancillary device according to claim 4, further comprising a built-off-self-test device hardware control circuit; and wherein, in accordance with an instruction output from the self-diagnostic section, the built-off-self-test device hardware control circuit sets conditions to individual circuits of the device.

7. The external test ancillary device according to claim 6, further comprising a digital-to-analog-converter control signal generation circuit which produces a control signal to the second data converter on the basis of a signal output from the built-off-self-test device hardware control circuit.

8. The external test ancillary device according to claim 7, wherein the digital-signal-processor analysis section acquires stored data from the measured data memory, performs arithmetic operation through use of the acquired data, determines whether to make a correction to the result of the arithmetic operation, and when a correction is required inputs data having a correction value again added thereto to the control signal generation circuit by way of the built-off-self-test device hardware control circuit.

9. The external test ancillary device according to claim 1, wherein the result of the self-diagnostic operation is transmitted in its present form to a peripheral device if the result is acceptable, and a self-correction operation is performed if the result is unacceptable, and the self-diagnostic operation is performed again if the result of the self-correction operation is acceptable and the result is transmitted to the peripheral device.

10. The external test ancillary device according to claim 1, wherein the one signal scheme corresponds to a digital signal, and the another signal scheme corresponds to an analog signal.

11. A method of testing a semiconductor device through use of the external test ancillary device defined in claim 1.

* * * * *